United States Patent
Cho et al.

(10) Patent No.: US 7,061,125 B2
(45) Date of Patent: Jun. 13, 2006

(54) SEMICONDUCTOR PACKAGE WITH PATTERN LEADS AND METHOD FOR MANUFACTURING THE SAME

(75) Inventors: Sung-Dae Cho, Cheonan (KR); Sang-Jun Kim, Cheonan (KR); Joo-Hyung Lee, Daegu (KR)

(73) Assignee: Samsung Electronics, Co. Ltd., Suwon (KR)

( * ) Notice: Subject to any disclaimer, the term of this patent is extended or adjusted under 35 U.S.C. 154(b) by 160 days.

(21) Appl. No.: 10/667,474

(22) Filed: Sep. 23, 2003

(65) Prior Publication Data

US 2004/0155322 A1   Aug. 12, 2004

(30) Foreign Application Priority Data

Feb. 7, 2003 (JP) .................. 10-2003-0007882

(51) Int. Cl.
*H01L 23/29* (2006.01)
(52) U.S. Cl. ..................... 257/790; 438/124
(58) Field of Classification Search ........ 257/673–676, 257/690, 777
See application file for complete search history.

(56) References Cited

U.S. PATENT DOCUMENTS 6,437,446 B1 * 8/2002 Uchida ................... 257/777
6,747,348 B1 * 6/2004 Jeung et al. .............. 257/686
6,750,547 B1 * 6/2004 Jeung et al. .............. 257/778

FOREIGN PATENT DOCUMENTS

KR  1019990237329  2/1997
KR  1020000251868  2/1997

* cited by examiner

*Primary Examiner*—Leonardo Andujar
(74) *Attorney, Agent, or Firm*—Harness, Dickey & Pierce, P.L.C.

(57) ABSTRACT

A semiconductor package utilizing insulating peripheral sealing portions and pattern leads and methods for manufacturing such semiconductor packages are provided. The semiconductor package includes a substrate on which a semiconductor chip is mounted. The substrate includes a plurality of substrate pads and the semiconductor chip includes a plurality of chip pads on an active surface. The semiconductor chip is surrounded by one or more peripheral sealing layers and conductive lead patterns are formed across the peripheral sealing layer(s) to connect the chip pads to corresponding substrate pads. The chip and lead patterns may be encapsulated and the substrate may also be provided with external connection structures such as solder balls to complete the package.

20 Claims, 9 Drawing Sheets

SEMICONDUCTOR PACKAGE WITH PATTERN LEADS AND METHOD FOR MANUFACTURING THE SAME

CROSS REFERENCE TO RELATED APPLICATIONS

This U.S. non-provisional application claims priority under 35 U.S.C. §119 to Korean Patent Application No. 2003-7882 filed Feb. 7, 2003, the contents of which are incorporated by reference.

BACKGROUND OF THE INVENTION

1. Field of the Invention

The present invention relates to an improved semiconductor package and a method for manufacturing such a package.

2. Description of the Related Art

Generally, a semiconductor chip is mounted on a substrate such as a tape wiring substrate, a ceramic wiring substrate or a printed circuit board. The semiconductor chip is then electrically connected to the substrate by wire bonding. The wire bonding process typically uses a capillary or a wedge device to connect bonding wires between chip pads on the semiconductor chip and corresponding substrate pads on the substrate.

The conventional wire bonding process, however, may damage the chip pads due to the force which may be applied to the chip pads by the capillary or wedge device as it attaches the bonding wires. Wire bonding methods may also cause defects when bonding wires warp, roll or shift as result of the flow of liquid epoxy molding compound (EMC) during the encapsulation process, shocks during transportation and other mechanical forces absorbed by the bonding wires. Warped, rolled and shifted bonding wires will tend to decrease the yield and/or reliability of the resulting devices.

Conventional wire bonding methods require a predetermined height above the active surface of the semiconductor chip for the formation and maintenance of the bonding wire loops. Although there are variations of this height requirement depending on the diameter of the bonding wires and the particular bonding method utilized, conventional wire bonding will typically require heights between 100 µm and 200 µm. Therefore, conventional wire bonding methods are limited in their ability to realize thin packages.

Crossing bonding wires in conventional cross bonding methods increase the risk of short circuit between the upper and lower bonding wires. To reduce the likelihood of short circuits, the height of the loops of the upper bonding wires are typically increased above that used for the lower bonding wires to increase the separation between the wires, consequently increasing the thickness of the resulting semiconductor packages.

SUMMARY OF THE INVENTION

One exemplary embodiment of the present invention is directed to a semiconductor package with pattern leads. The semiconductor package comprises a semiconductor chip having an active surface and a back surface. The active surface of the semiconductor chip includes a plurality of chip pads and an insulating protective layer covering the remainder of the active surface of the semiconductor chip. A substrate has a plurality of substrate pads. The back surface of the semiconductor chip is attached on the top surface of the substrate and a first peripheral sealing portion is formed on the substrate and along the periphery of the semiconductor chip, including a peripheral portion of the active surface.

First pattern leads are then formed along the semiconductor chip, the first peripheral sealing portion and the top surface of the substrate to connect the chip pads of the semiconductor chip to the corresponding substrate pads of the substrate. A resin encapsulant may then be used to encapsulate the semiconductor chip, the substrate pads and the first pattern leads. Various external connection terminals may be provided on the substrate and electrically connected to the substrate pads.

The semiconductor package may further comprise a second peripheral sealing portion and second pattern leads. The second peripheral sealing portion may seal the first peripheral sealing portion including the first pattern leads. Second pattern leads may then be formed along the semiconductor chip, the second peripheral sealing portion and the top surface of the substrate to connect chip pads of the semiconductor chip to corresponding substrate pads of the substrate. The second pattern leads may also include one or more second pattern leads formed on the second peripheral sealing portion that cross over one or more of the first pattern leads that are sealed beneath the second peripheral sealing portion. The first and second peripheral sealing portions may be made of a photo solder resist or a plastic resin. The second peripheral sealing portion may further seal those chip pads of the semiconductor chip that are connected to one of the first pattern leads. The first and second pattern leads may be formed by dispensing a flowable conductive composition, such as a conductive ink or polymer, or by using other conventional metal deposition methods.

Another exemplary embodiment of the present invention provides a method for manufacturing a semiconductor package with pattern leads comprising the steps of (a) providing a semiconductor chip having a plurality of chip pads and an insulating protective layer on an active surface, and a substrate having a plurality of substrate pads, (b) attaching the semiconductor chip to the substrate, (c) forming a first peripheral sealing portion along the periphery of the semiconductor chip, typically including a peripheral portion of the active surface, (d) forming first pattern leads along the semiconductor chip, the first peripheral sealing portion and the top surface of the substrate to connect the chip pads to the corresponding substrate pads, (e) encapsulating the semiconductor chip, the substrate pads and the first pattern leads with a resin material, and (f) forming external connection terminals that are electrically connected to the substrate pads.

In another exemplary embodiment, (d) may further comprise the steps of (d1) forming a second peripheral sealing portion to seal the first peripheral sealing portion including the first pattern leads and (d2) forming second pattern leads along the semiconductor chip, the second peripheral sealing portion and the top surface of the substrate to connect the chip pads to the corresponding substrate pads. Similarly, (f) may further comprise encapsulating the second peripheral sealing portion and the second pattern leads with a resin material.

BRIEF DESCRIPTION OF THE DRAWINGS

These and other objects, features and advantages of the present invention will be readily understood with reference to the following detailed description thereof provided in conjunction with the accompanying drawings, wherein the same reference numerals designate corresponding structural elements, and, in which:

FIG. 2 is a plan view of a semiconductor chip mounted on a substrate;

FIG. 3 is a plan view illustrating the formation of a peripheral sealing portion;

FIG. 4 is a cross-sectional view taken along the line 4—4 in FIG. 3;

FIG. 5 is a cross-sectional view illustrating the formation of pattern leads by dispensing a conductive ink to electrically connect the semiconductor chip to the substrate;

FIG. 6 is a cross-sectional view illustrating the formation of a resin encapsulant;

FIG. 7 is a cross-sectional view illustrating the formation of solder balls;

FIG. 8 is a plan view illustrating the formation of first pattern leads;

FIG. 9 is a plan view illustrating the formation of a second peripheral sealing portion;

FIG. 10 is a cross-sectional view taken along the line 10—10 in FIG. 9;

FIG. 11 is a cross-sectional view taken along the line 11—11 in FIG. 9;

FIG. 12 is a plan view illustrating the formation of second pattern leads;

FIG. 13 is a cross-sectional view taken along the line 13—13 in FIG. 12;

FIG. 14 is a cross-sectional view illustrating the formation of a resin encapsulant; and FIG. 15 is a cross-sectional view illustrating the formation of solder balls.

DETAILED DESCRIPTION OF THE INVENTION

Exemplary embodiments of the present invention will be described below with reference to the accompanying drawings.

Figure 1:
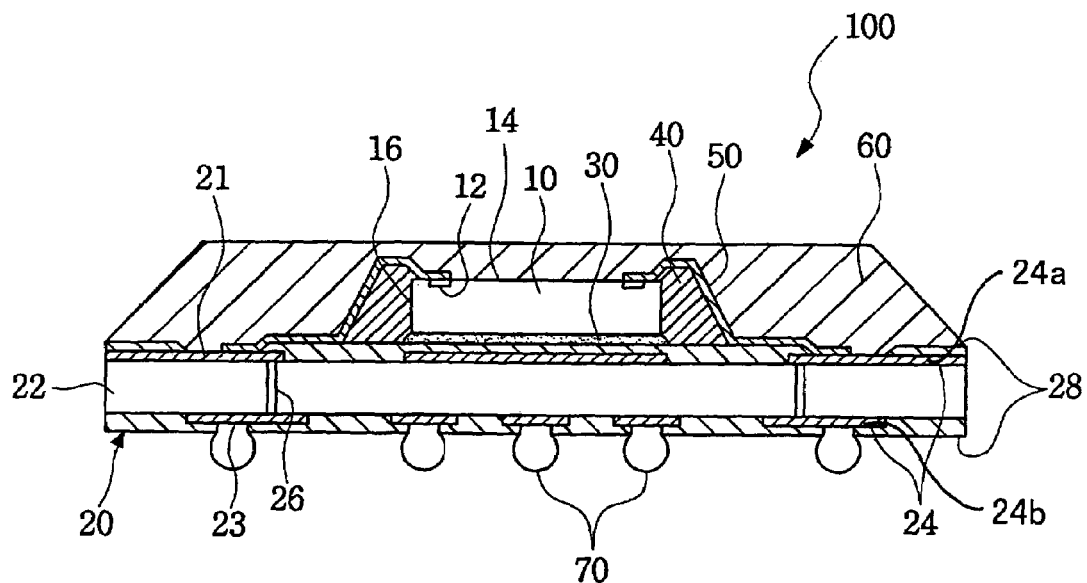
FIG. 1 is a cross-sectional view of a semiconductor package with pattern leads in accordance with a first exemplary embodiment of the present invention.

FIG. 1 is a cross-sectional view of a semiconductor package 100 with pattern leads 50 in accordance with a first embodiment of the present invention. As illustrated in FIG. 1, the semiconductor package 100 comprises a semiconductor chip 10 having an active surface and a back surface. The back surface of the semiconductor chip 10 is attached to the top surface of a substrate 20. An insulating peripheral sealing portion 40 is formed along the periphery 16 of the semiconductor chip 10. Pattern leads 50 electrically connect the substrate 20 to the semiconductor chip 10. A resin encapsulant 60 encapsulates the semiconductor chip 10, the pattern leads 50 and the connection portion to protect them. External connection terminals 70 are formed on the bottom surface of the substrate 20.

In accordance with a first exemplary embodiment of the present invention, the pattern leads 50 are formed to provide electrical connections between chip pads 12 and substrate pads 21. The use of lead patterns rather than bonding wires permits a reduction of the height of electrical connection means to the thicknesses of the peripheral sealing portion 40 and the pattern leads 50, thereby allowing a reduction in the thickness of the resulting semiconductor package 100.

In accordance with a first exemplary embodiment of the present invention, the semiconductor chip 10 has a plurality of chip pads 12 arrayed on the active surface of the chip. The chip pads 12 may be disposed along the periphery of the active surface of the semiconductor chip 10. An insulating protective layer 14 typically covers the remaining active surface of the semiconductor chip 10. Although this exemplary embodiment is illustrated with edge-pad-type semiconductor chip 10, center-pad-type and combination pad type chips may also be used.

The substrate 20 may be a printed circuit board comprising a substrate body 22 having a top surface and a bottom surface and a multi-layered metal wiring structure 24 formed on the substrate body 22. The metal wiring structure 24 may include an upper wiring layer 24a and a lower wiring layer 24b. The upper wiring layer 24a may located on the top surface of the substrate body and may include the substrate pads 21. The lower wiring layer 24b may be located on the bottom surface of the substrate body 22 and may include solder ball pads 23 to which solder balls 70 may be attached or other conductive structures arranged and configured for other means of making external electrical connections.

The metal wiring structure 24 may be formed by patterning a copper foil on the substrate body 22 and a solder resist layer 28 may be formed on the entire surface of the substrate 20, except for the solder ball pads 23, the substrate pads 21 and possibly the chip mounting region. Via holes 26 penetrate the substrate body 22 and are filled with a conductive material to electrically connect the substrate pads 21 to the ball pads 23. Although this embodiment shows a printed circuit board being used as the substrate 20, other wiring substrates such as a ceramic substrate or tape wiring substrates may be used.

The peripheral sealing portion 40 is formed along the periphery 16 of the semiconductor chip 10 and will typically encompass including a peripheral portion of the active surface of the semiconductor chip 10. The peripheral sealing portion 40 is preferably made from one or more insulative materials such as photo solder resists (PSR) and plastic resins in order to prevent electrical short circuits which may occur between the pattern leads 50 and the periphery 16 of the semiconductor chip 10. Because the active surface of the semiconductor chip 10 is typically covered with an insulating protective layer 14, the conductive pattern leads 50 can be directly formed on the protective layer. However, because the periphery 16 of the semiconductor chip 10 is exposed by the wafer sawing process, without the peripheral sealing portion 40, electrical short circuits may occur if the pattern leads 50 come in contact with portions of the peripheral (side) surfaces of the semiconductor chip 10.

The peripheral sealing portion 40 is preferably formed with a known inclination. Such a peripheral sealing portion 40 may also serve as a base plate that increases the attachment of the pattern leads 50. The peripheral sealing portion 40 may be formed near the periphery 16 of the semiconductor chip 10 and will typically have an inclination of less than 90 degrees, such as 30 to 75 degrees, to improve the ability to form and adhere pattern leads 50 across the inclined face of the peripheral sealing portion.

The pattern leads 50 typically extend across a portion of the semiconductor chip 10, the peripheral sealing portion 40 and the top surface of the substrate 20. The pattern leads 50 electrically connect the substrate pads 21 of the substrate 20 to the chip pads 12 of the semiconductor chip 10. The pattern leads 50 may be formed by dispensing a conductive composition, such as a conductive ink or polymer, or by using other conventional methods of forming a metal lead pattern.

The resin encapsulant 60 encapsulates the semiconductor chip 10, the peripheral sealing portion 40, the substrate pads 21, the pattern leads 50 and the electrical connection portions 24 to protect them from the external environment. The resin encapsulant 60 may be formed by applying a liquid epoxy molding compound (EMC) or using other conventional molding methods and materials.

The solder balls 70 or other external connection terminals are connected to the solder ball pads 23 and electrically connected to the substrate pads 21 through the via holes 26.

In this embodiment, the height of electrical connection means is the thickness of the peripheral sealing portion 40 plus that of the pattern leads 50. Therefore, the height required for forming the electrical connection means may be reduced to less than about 50 μm and possibly less than about 10 μm, depending on the particular materials used and the current and voltage requirements for operation of the packaged device while reducing the likelihood of various process, yield and reliability issues associated with the use of bonding wires.

Figure 2:
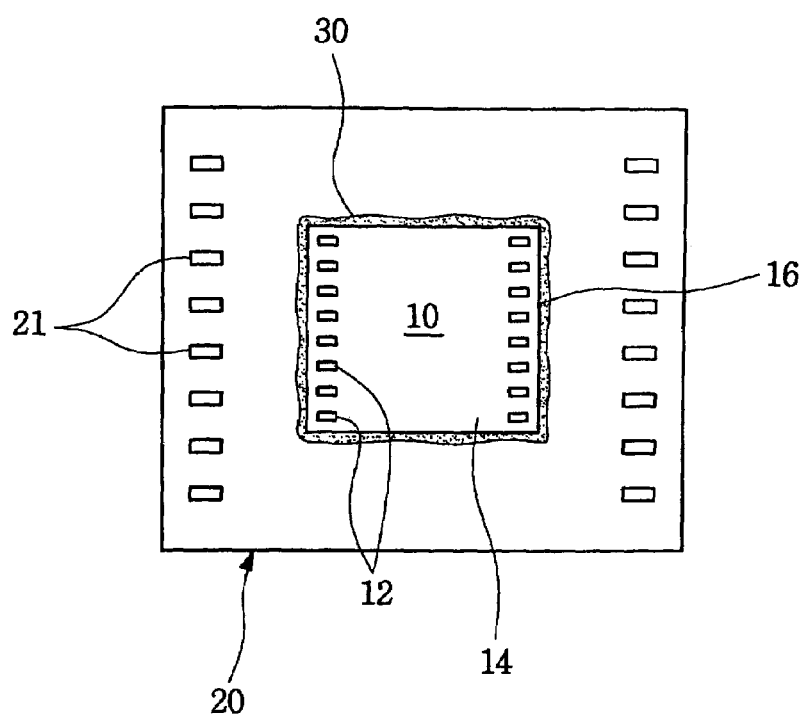
FIGS. 2 through 7 are views illustrating a method for manufacturing the semiconductor package of FIG. 1 in accordance with a first exemplary embodiment of the present invention.

FIGS. 2–7 illustrate an exemplary method for manufacturing a semiconductor package in accordance with a first exemplary embodiment of the present invention. Referring to FIG. 2, a semiconductor chip 10 and a substrate 20 are provided with the back surface of the semiconductor chip 10 attached to the top surface of substrate 20 by an adhesive 30. The adhesive 30 may be an nonconductive or conductive adhesive. The substrate 20 has substrate pads 21 formed on the top surface thereof, typically near the semiconductor chip 10.

Figure 3:
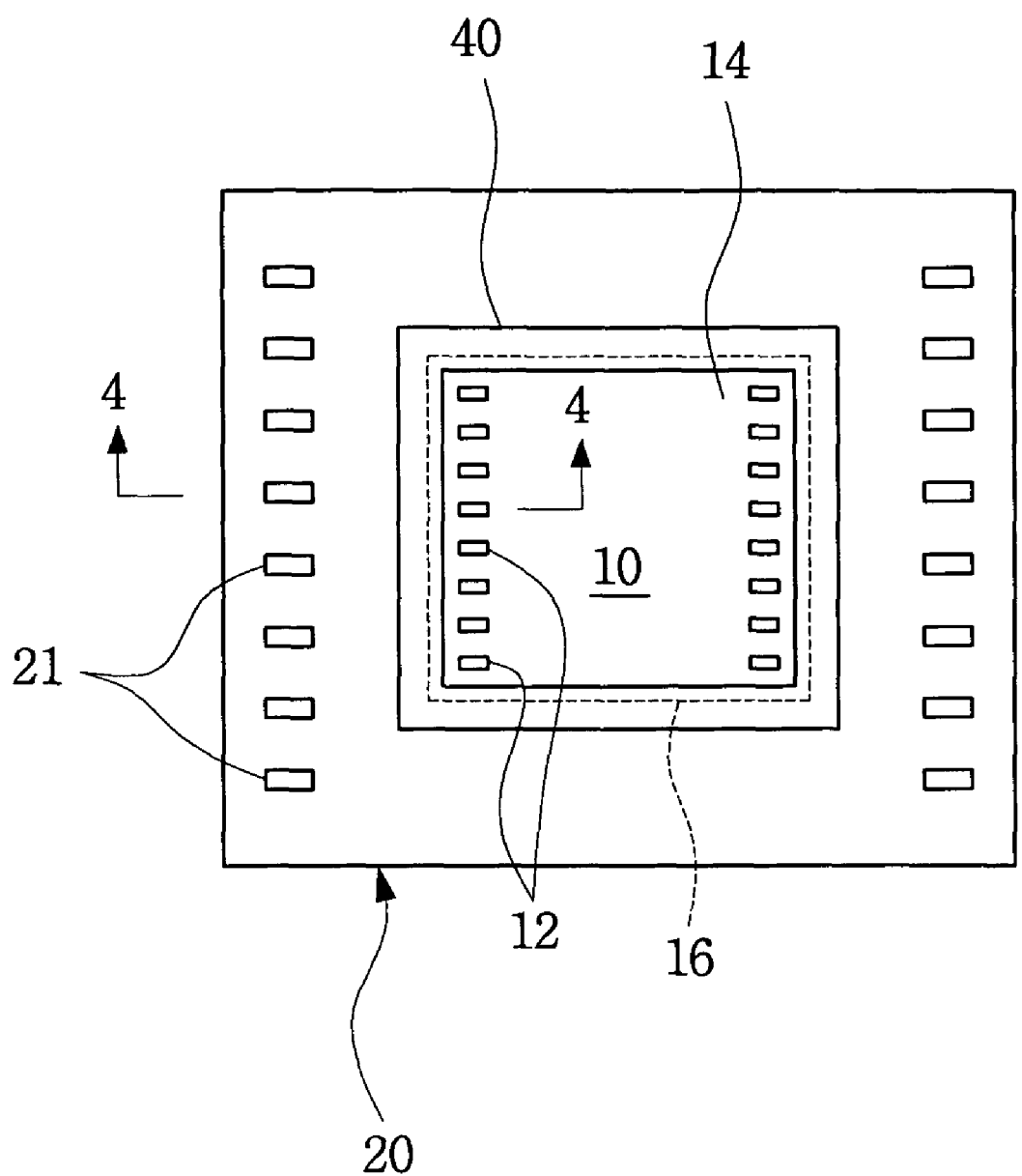
Figure 4:
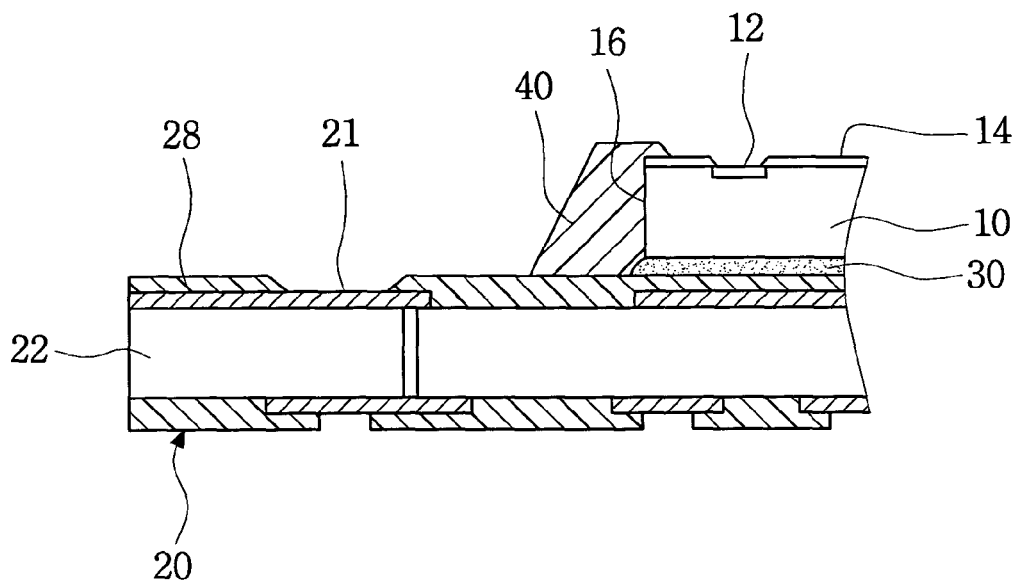

Referring to FIGS. 3 and 4, a peripheral sealing portion 40 is formed by applying one or more insulative materials, such as a photo solder resist or a plastic resin around the periphery 16 of the semiconductor chip 10, typically including a peripheral portion of the active surface. The peripheral sealing portion 40 is located between chip pads 12 of the semiconductor chip 10, and the substrate pads 21 of the substrate 20.

Figure 5:
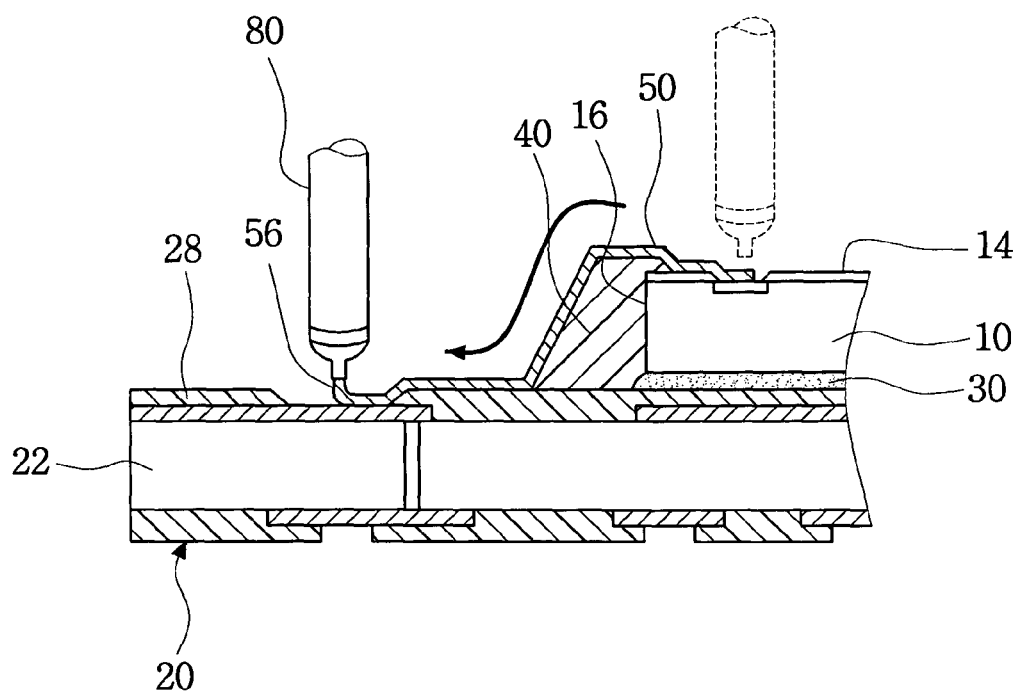

Referring to FIG. 5, pattern leads 50 are formed to connect the chip pads to the corresponding substrate pads. The pattern leads 50 are formed along the semiconductor chip 10, the peripheral sealing portion 40 and the top surface of the substrate 20. The pattern leads 50 may be formed using a dispenser 80 that is filled with a conductive composition 56, such as a conductive ink or polymer, having a predetermined viscosity range.

A typical viscosity range for such conductive compositions will be about 30,000 to about 35,000 poise although depending on the equipment used and the configuration of the peripheral sealing portion, thicker or thinner compositions may be used to ensure satisfactory patterning and lead retention. The conductivity requirements for the pattern leads will, of course, vary depending on the particular semiconductor chip(s) incorporated and the performance specifications of the resulting device(s), but generally higher conductivity (lower resistivity) is preferred to more closely match the performance of conventional copper or gold leads.

A dispensing operation may be performed starting from the upper surface of the chip pads 12 and then moving the dispenser 80 to the corresponding substrate pads 21 of the substrate 20 while continually dispensing the conductive composition. The peripheral sealing portion 40 is preferably formed with an inclination within a predetermined degree range, such as 30 to 75 degrees, for securing the pattern leads 50 and simplifying the formation of the pattern leads.

Although the illustrated embodiment utilizes a dispensing method to form pattern leads 50, other conventional metal pattern formation methods such as evaporating, sputtering, plating and reducing may be used to form the original metal layer and coupled with patterning, etching and lift-off techniques to form the desired metal patterns.

Figure 6:
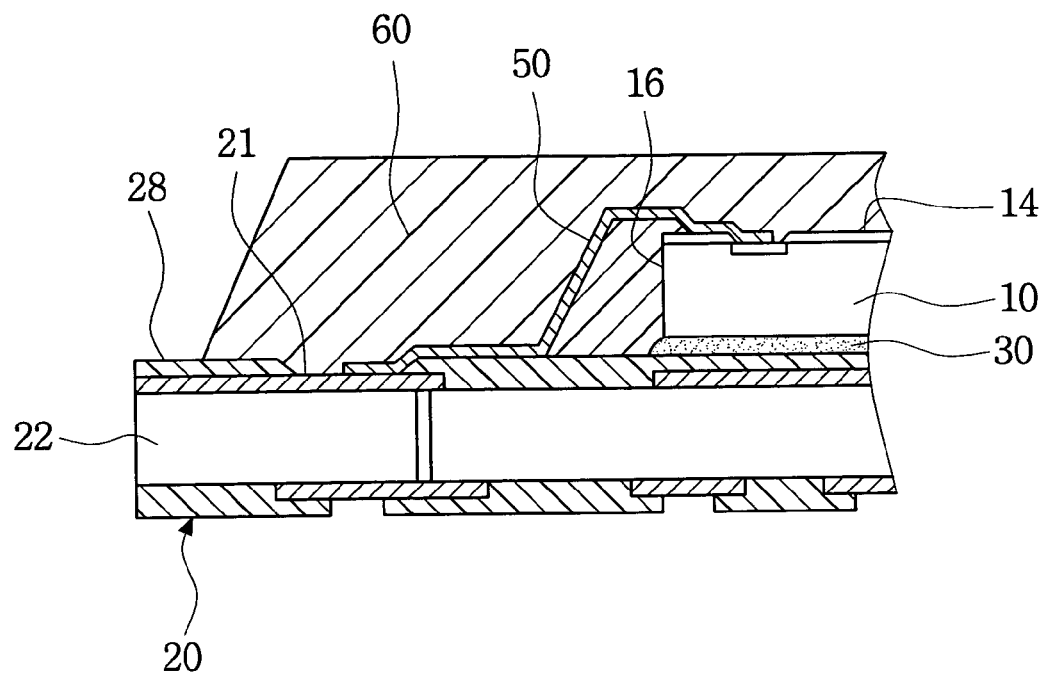

Referring to FIG. 6, a resin encapsulant 60 is may then be formed to encapsulate the semiconductor chip 10, the peripheral sealing portion, the substrate pads 21, the pattern leads 50 and the electrical connection portion using a liquid EMC or other insulating material.

Figure 7:
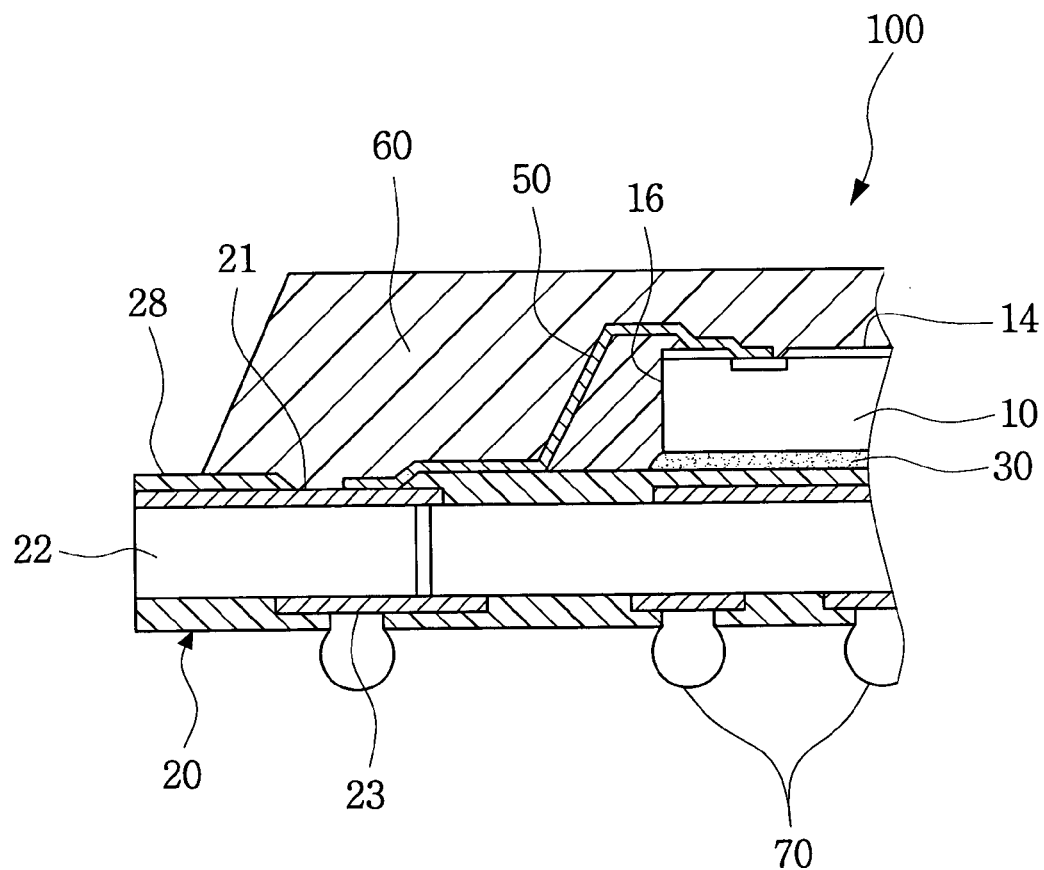

Referring to FIG. 7, solder balls 70 or other external connection terminals are formed on the substrate 20 and may be attached on solder ball pads 23 or other conductive structures formed on the bottom surface of the substrate 20 and electrically connected to the substrate pads 21 through via holes.

Although this first exemplary embodiment has illustrated and described pattern leads being formed on a single-layered peripheral sealing portion, multi-layered pattern leads may be formed on a peripheral sealing portion having two or more layers.

Likewise, although the second exemplary embodiment described below discloses pattern leads being formed on a two-layered peripheral sealing portion, a person of ordinary skill in the art will appreciate that multi-layered pattern leads may also be formed on peripheral sealing portion made of three or more layers using the same or similar techniques.

The second exemplary embodiment of the present invention provides a method for forming offset, shifted or dislocated leads for providing electrical connections between the chip pads and the corresponding substrate pads, in a package having a two-layered peripheral sealing portion and two layers of pattern leads. FIGS. 8–15 illustrate an exemplary method for manufacturing a semiconductor package in accordance with a second exemplary embodiment of the present invention. The same reference numerals are used to designate similar or corresponding structural elements throughout the drawings.

In order to clearly describe the two-layered peripheral sealing portion and pattern leads, a lower peripheral sealing portion and lower pattern leads are hereinafter referred to as a first peripheral sealing portion and first pattern leads, respectively. An upper peripheral sealing portion and upper pattern leads are hereinafter referred to as a second peripheral sealing portion and second pattern leads, respectively.

Because the steps of forming a first peripheral sealing portion 142 and first pattern leads 152 may be the same as the steps described above for forming the peripheral sealing portion 40 and the pattern leads 50 in the first exemplary embodiment, the description thereof is herein omitted in the interest of brevity and incorporated, in its entirety, by reference.

Figure 8:
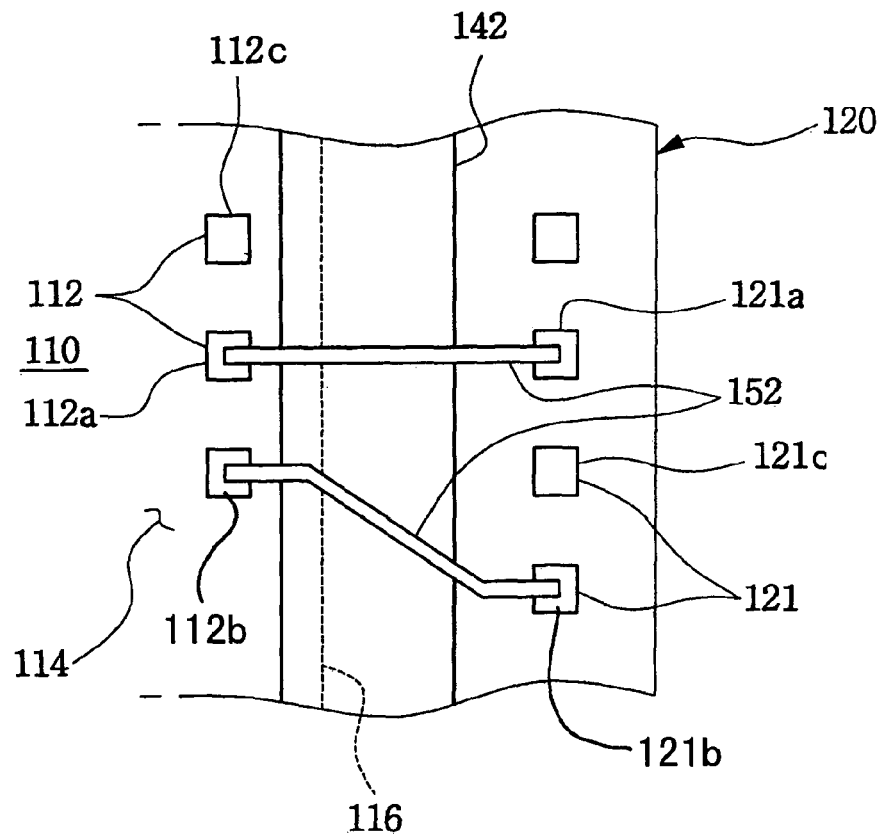
FIGS. 8 through 15 are views illustrating the manufacture of a semiconductor package in accordance with a second embodiment of the present invention.

Referring to FIG. 8, the step of forming the first pattern leads 152 is performed to electrically connect chip pads 112a–b to the corresponding substrate pads 121a–b. The first pattern leads 152 include at least one dislocated pattern lead connecting chip pads 112b of the semiconductor chip 110 to corresponding substrate pads 121b of the substrate 120. An insulating protective layer 114 is typically provided on the remaining portion of the active surface of the semiconductor chip 110.

Figure 9:
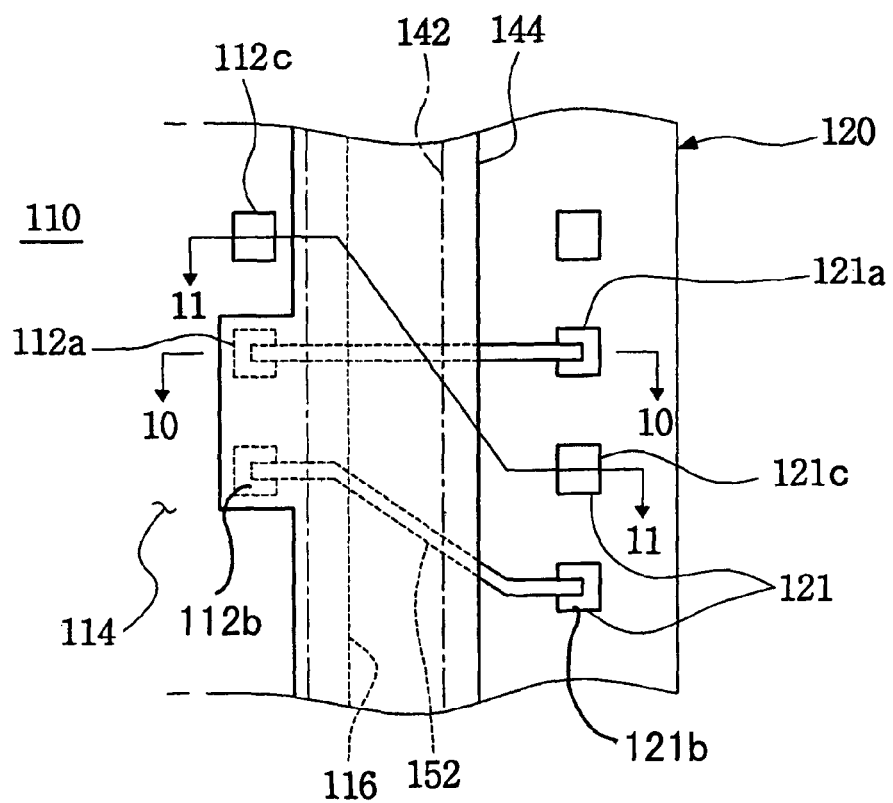
Figure 10:
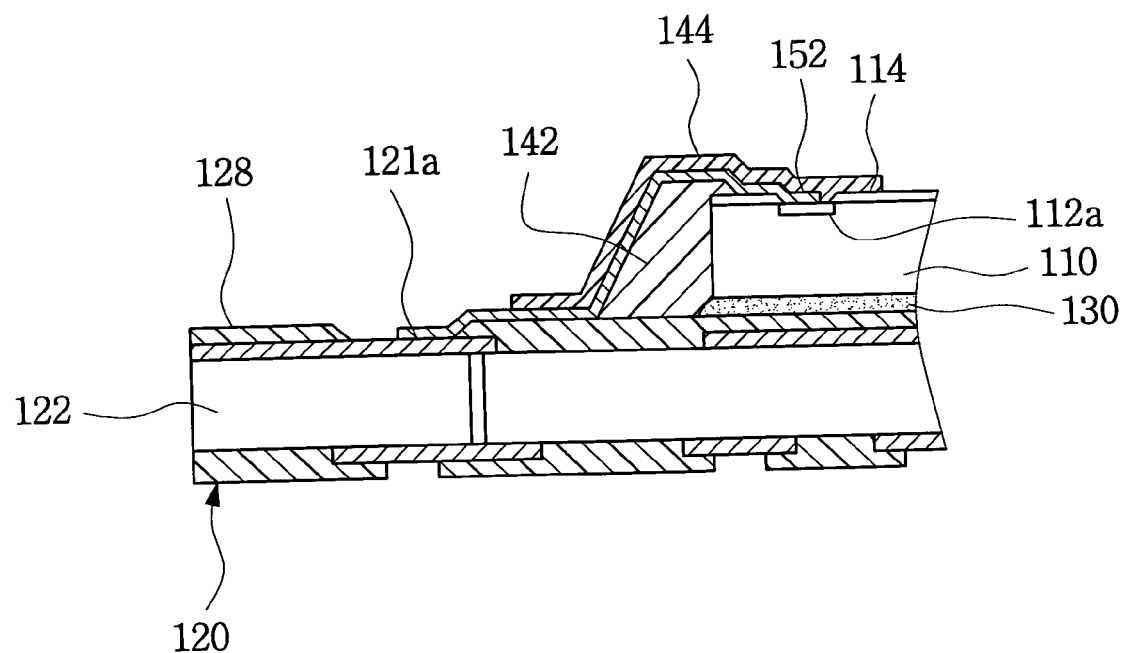
Figure 11:
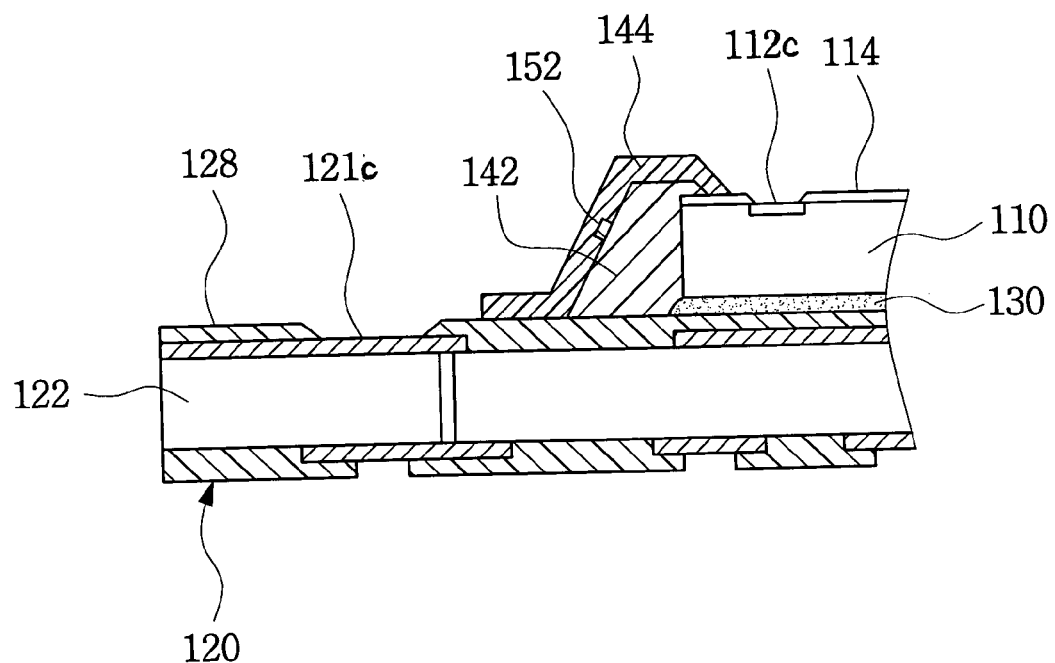

FIGS. 9 through 11 illustrate the formation of a second peripheral sealing portion 144. The second peripheral sealing portion 144 encompasses the first peripheral sealing portion 142 to contain the first pattern leads 152 formed on the first peripheral sealing portion 142. The second peripheral sealing portion 144 further covers the chip pads 112a–b of the semiconductor chip 110 that are connected to one of the first pattern leads 152. The second peripheral sealing portion 144 does not, however, cover the chip pads 112c that have not yet been connected to the substrate.

FIG. 10 illustrates that the second peripheral sealing portion 144 seals the chip pads 112a of the semiconductor chip 110 and a majority of first pattern leads 152. FIG. 11 illustrates that the second peripheral sealing portion 144 is formed to expose the chip pads 112c that have not yet been connected to the corresponding substrate pads 121c.

Figure 12:
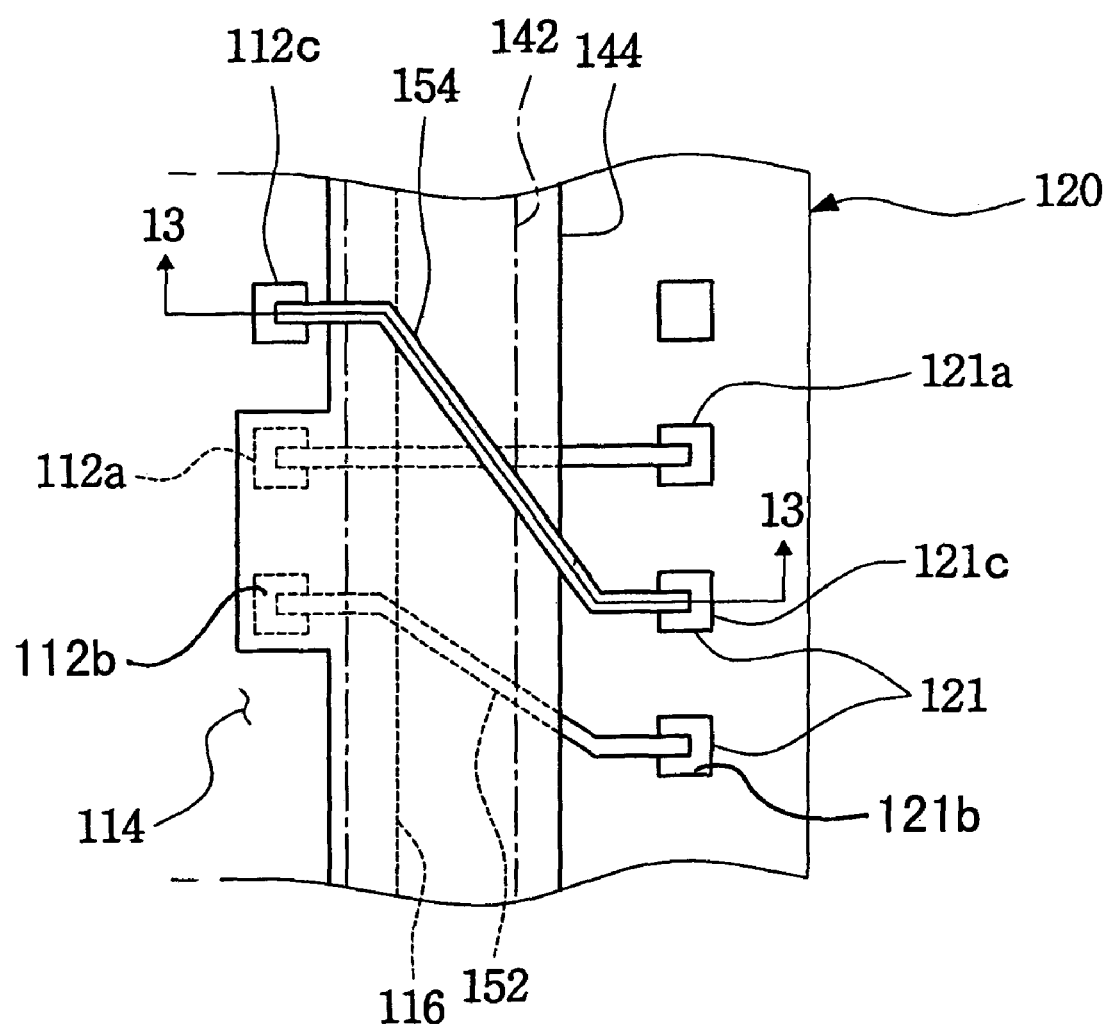
Figure 13:
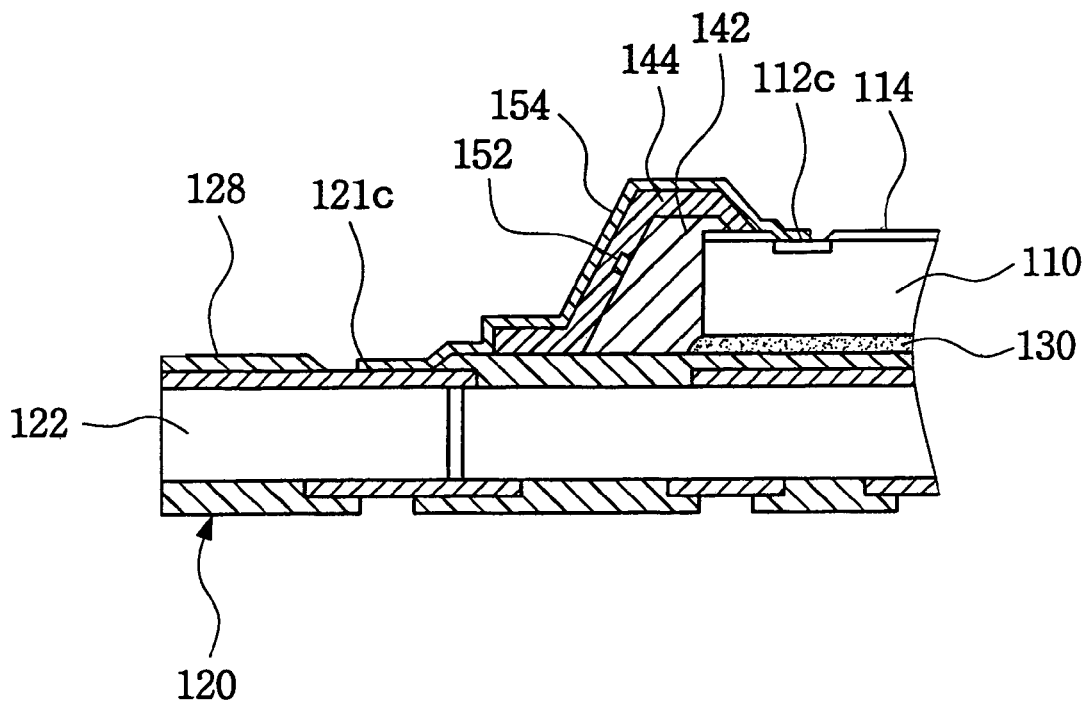

FIGS. 12 and 13, illustrate the formation of second pattern leads 154 along the semiconductor chip 110, the second peripheral sealing portion 144 and the top surface of the substrate 120. The second pattern leads 154 connect the chip pads 112c of the semiconductor chip 110 to the corresponding substrate pads 121c of the substrate 120. The method for forming the second pattern leads 154 may be the same as the method use to form the pattern leads 50 in the first exemplary embodiment.

At least one second pattern lead 154 is electrically connected to a corresponding substrate pad 121c in a manner that causes the second pattern lead to cross over a first pattern lead 152 that is arranged beneath the surface of the second peripheral sealing portion 144. The second peripheral sealing portion 144 is formed from insulating materials and reduces the likelihood that electrical short circuits will occur between the first pattern leads 152 and the crossing second pattern leads 154. The second pattern leads 154 are formed on the upper surface of the second peripheral sealing portion 144, which may reduce the package thickness compared to the conventional wire bonding method for crossbonding selected chip pads 112a–c on the semiconductor chip and substrate pads 121a–c on the substrate 120.

The basic multi-level pattern lead formation process detailed above may also be utilized in multi-chip stack packages with, for example, a first peripheral sealing portion formed adjacent the edge of the active surface of a lower semiconductor chip with first pattern leads formed on the first peripheral sealing portion to connect the first chip. After mounting a second (upper) semiconductor chip on the active surface of the first semiconductor chip, a second peripheral sealing portion may be formed adjacent the edge of the active surface of the upper semiconductor chip, thereby insulating the first pattern leads and providing a surface on which second pattern leads may be formed. Depending on the connection requirements of the semiconductor chips utilized, multiple edge sealing portions and lead levels may, of course, be used with one or more of the stacked chips.

Those embodiments incorporating more than one set of pattern leads may also utilize different conductive materials and/or lead sizing when forming the various pattern lead levels. In this manner the effective resistance of particular leads may be adjusted to some degree to achieve, for instance, a decrease in the resistance for Vcc and Vss leads relative to the signal leads.

Figure 14:
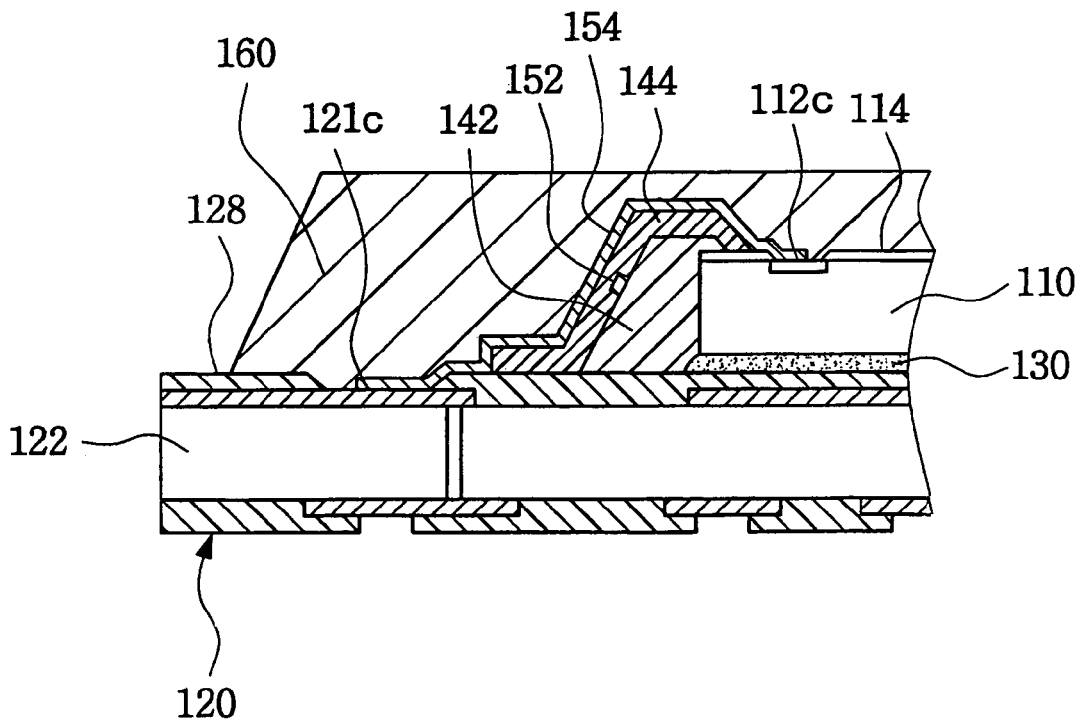
Figure 15:
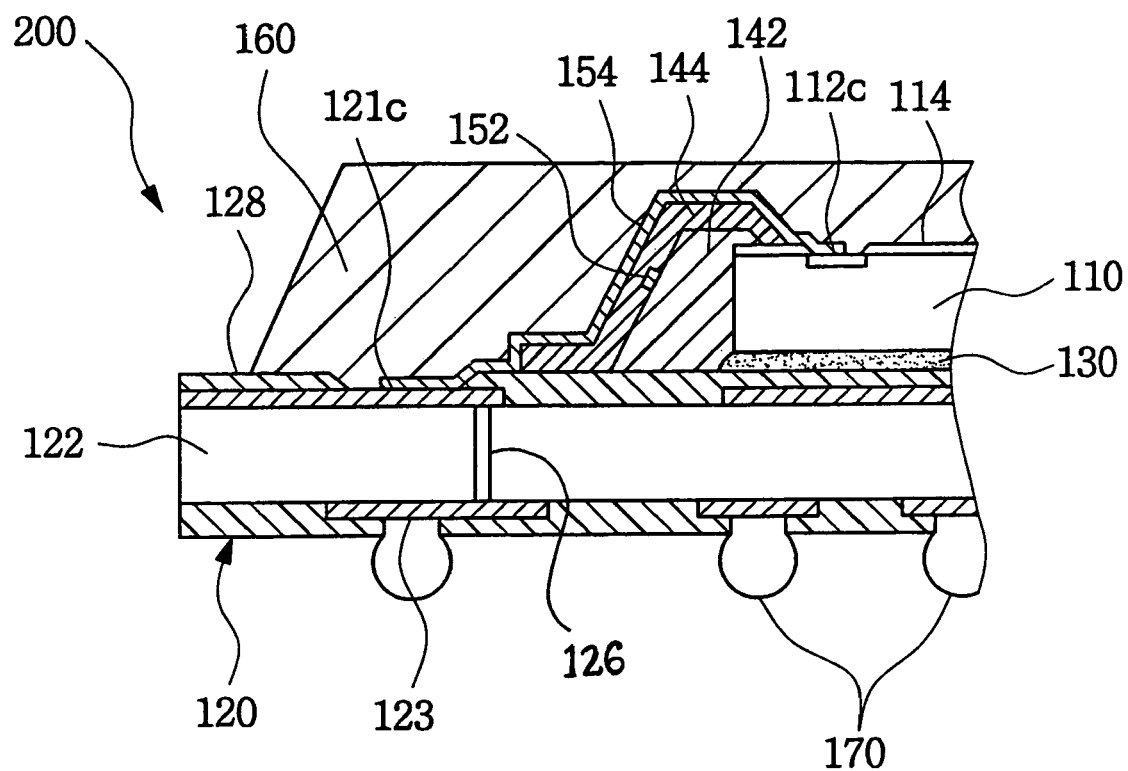

FIG. 14 illustrates the formation of a resin encapsulant 160 encapsulating the semiconductor chip 110, the first and second peripheral sealing portions 142, 144, the substrate pads 121c and the first and second pattern leads 152 and 154 and the electrical connection portion. The encapsulant may be a liquid EMC or other suitable material. FIG. 15 illustrates the formation of solder balls 170 on solder ball pads 123 that are provided on the bottom surface of the substrate 120. The solder balls 170 are electrically connected to the substrate pads 121c through via holes 126. Although the illustrated embodiment utilizes solder balls, other forms of external connection may be connected to substrate pads to produce various package configurations.

When chip pads are smaller than the bonding wires, there is an increased risk of electrical short circuits between bonding wires bonded to adjacent chip pads. However, the multi-pattern lead structure of the second exemplary embodiment of present invention may be utilized to reduce the likelihood of such electrical short circuits. The multi-pattern lead structure may also be applied to semiconductor chips, on which the chip pads are arranged in a plurality of rows and may be adopted for use with multi-chip stacked packages. The steps of forming peripheral sealing portions and pattern leads may be repeated to form a multi-pattern lead structure contacting each row of chip pads and/or with each pattern lead structure contacting a different chip within the multi-chip stack.

In accordance with the exemplary embodiments of the present invention, the insulating peripheral sealing portion is formed along the periphery of the semiconductor chip. The chip pads of the semiconductor chip are electrically connected to the substrate pads of the substrate by the pattern leads. Thereby reducing or eliminating certain problems associated with conventional bonding wire processes.

The present invention may have multi-layered pattern leads with intervening insulating peripheral sealing portions formed between layers of the pattern leads. This arrangement allows pattern leads on different layers to cross, thereby increasing the flexibility in the arrangement of the chip pads on both the semiconductor chip and the substrate. Further, the width of the pattern leads can be adjusted and be multi-layered, thereby permitting a reduction in the size of the chip pads of the semiconductor chip.

Although the exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A semiconductor package comprising:
    a substrate having a top surface including a plurality of substrate pads;
    a semiconductor chip mounted on the substrate, the semiconductor chip having an active surface and a peripheral surface, the active surface including a plurality of chip pads;
    a first peripheral sealing portion formed along the peripheral surface of the semiconductor chip;
    at least one pattern lead providing an electrical connection between at least one first chip pad of the plurality of chip pads and at least one substrate pad of the plurality of substrate pads; and
    a second peripheral sealing portion formed along the first peripheral sealing portion covering the at least one first chip pad and a portion of the at least one pattern lead without covering at least one second chip pad of the plurality of chip pads.

2. A semiconductor package according to claim 1, further comprising:
    an encapsulant covering the semiconductor chip, the first peripheral sealing portion, the second peripheral sealing portion, the substrate pads, and the at least one pattern lead.

3. A semiconductor package according to claim 1, wherein:

the first peripheral sealing portion covers a first peripheral portion of the active surface; and the second peripheral sealing portion covers a second peripheral portion of the active surface.

4. A semiconductor package according to claim 1, further comprising:

external connection terminals formed on the substrate, the external connection terminals being electrically connected to the substrate pads.

5. A semiconductor package according to claim 4, wherein:

the external connection terminals are arranged on the bottom surface of the substrate and are selected from a group consisting of solder balls, solder bumps, microsprings and connecting pins.

6. A semiconductor package according to claim 4, wherein:

the external connection terminals are arranged on the top surface of the substrate.

7. A semiconductor package according to claim 1, wherein:

an inclined surface of the first peripheral sealing portion forms an angle of between about 30 and 75 degrees relative to the top surface of the substrate; and an inclined surface of the second peripheral sealing portion forms an angle of between about 30 and 75 degrees relative to the top surface of the substrate.

8. A semiconductor package according to claim 1, wherein:

the first peripheral sealing portion and second peripheral sealing portion include an insulating composition selected from a group consisting of photo solder resists and plastic resins.

9. A semiconductor package comprising:

a substrate having a top surface and a bottom surface, the top surface including a plurality of substrate pads;

a semiconductor chip mounted on the substrate, the semiconductor chip having an active surface, a back surface, and a peripheral surface, the active surface including a plurality of chip pads;

a first peripheral sealing portion formed along the peripheral surface of the semiconductor chip;

a plurality of first pattern leads providing electrical connections between a first group of chip pads and a first group of substrate pads, the first pattern leads extending along an inclined surface of the first peripheral sealing portion;

a second peripheral sealing portion formed along the first peripheral sealing portion and the first pattern leads; and a plurality of second pattern leads providing electrical connections between a second group of chip pads and a second group of substrate pads, the second pattern leads extending along an inclined surface of the second peripheral sealing portion.

10. A semiconductor package according to claim 9, wherein:

a second pattern lead extends across a first pattern lead, electrical connection between the second pattern lead and the first pattern lead being prevented by an interposed portion of the second peripheral sealing portion.

11. A semiconductor package according to claim 9, wherein:

the first group of chip pads is completely separate from the second group of chip pads.

12. A semiconductor package according to claim 9, wherein:

at least one chip pad is included in both the first group of chip pads and the second group of chip pads.

13. A semiconductor package according to claim 9, further comprising:

an encapsulant covering the semiconductor chip, the first peripheral sealing portion, the substrate pads, the first pattern leads, the second peripheral sealing portion and the second pattern leads.

14. A semiconductor package according to claim 9, wherein:

the first peripheral sealing portion covers a first peripheral portion of the active surface; and the second peripheral sealing portion covers a second peripheral portion of the active surface.

15. A semiconductor package according to claim 9, further comprising:

external connection terminals formed on the substrate, the external connection terminals being electrically connected to the substrate pads.

16. A semiconductor package according to claim 15, wherein:

the external connection terminals are arranged on the bottom surface of the substrate and are selected from a group consisting of solder balls, solder bumps, microsprings and connecting pins.

17. A semiconductor package according to claim 15, wherein:

the external connection terminals are arranged on the top surface of the substrate.

18. A semiconductor package according to claim 9, wherein:

the inclined surface of the first peripheral sealing portion forms an angle of between about 30 and 75 degrees relative to the top surface of the substrate; and the inclined surface of the second peripheral sealing portion forms an angle of between about 30 and 75 degrees relative to the top surface of the substrate.

19. A semiconductor package according to claim 9, wherein:

the first and second peripheral sealing portions include an insulating composition selected from a group consisting of photo solder resists and plastic resins.

20. A method for manufacturing a semiconductor package comprising:

mounting a semiconductor chip on a substrate, the semiconductor chip having a plurality of chip pads on an active surface and the substrate having a plurality of substrate pads on a top surface;

forming a first peripheral sealing portion, the first peripheral sealing portion enclosing a peripheral surface of the semiconductor chip and having an inclined surface;

forming at least one pattern lead to establish an electrical connection between at least one first chip pad of the plurality of chip pads and a corresponding at least one substrate pad of the plurality of substrate pads, the at least one pattern lead being formed on the inclined surface of the first peripheral sealing portion; and forming a second peripheral sealing portion along the first peripheral sealing portion covering the at least one first chip pad and a portion of the at least one pattern lead without covering at least one second chip pad of the plurality of chip pads.

* * * * *